(12) United States Patent
Yin et al.

(10) Patent No.: US 6,281,100 B1
(45) Date of Patent: *Aug. 28, 2001

(54) SEMICONDUCTOR PROCESSING METHODS

(75) Inventors: Zhiping Yin; Ravi Iyer, both of Boise; Thomas R. Glass, Idaho City; Richard Holscher, Boise; Ardavan Niroomand, Boise; Linda K. Somerville, Boise; Gurtej S. Sandhu, Boise, all of ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/146,842

(22) Filed: Sep. 3, 1998

(51) Int. Cl.⁷ .................................................. H01L 21/3205

(52) U.S. Cl. .............................................. 438/585; 438/682

(58) Field of Search ...................................... 438/585, 586, 438/593, 595, 682, 211, 648; 257/315, 316

(56) References Cited

U.S. PATENT DOCUMENTS

| | | |
|---|---|---|
| 4,954,867 | 9/1990 | Hosaka ................................. 357/52 |
| 5,034,348 | 7/1991 | Hartswick et al. . |
| 5,340,621 | 8/1994 | Matsumoto et al. . |
| 5,441,797 | 8/1995 | Hogan et al. ......................... 428/209 |
| 5,472,827 | 12/1995 | Ogawa et al. ........................ 430/315 |
| 5,472,829 | 12/1995 | Ogawa . |
| 5,591,566 | 1/1997 | Ogawa . |

(List continued on next page.)

FOREIGN PATENT DOCUMENTS

| | | |
|---|---|---|
| 0 471 185 A2 | 2/1992 | (EP) . |
| 0 588 087 A2 | 3/1994 | (EP) . |
| 0 588 087 A3 | 3/1994 | (EP) . |
| 0 778 496 A2/A3 | 6/1997 | (EP) . |
| 06067019A | 3/1994 | (JP) . |
| 9-55351 | 2/1997 | (JP) . |
| WO 99/20029 | 8/1999 | (WO) . |
| WO 99/20030 | 8/1999 | (WO) . |

OTHER PUBLICATIONS

TEXT: Wolf, S. et. al., "Silicon Processing For The VLSI Era", vol. 1, pp. 437–441.

(List continued on next page.)

*Primary Examiner*—Vu A. Le
*Assistant Examiner*—Bradley K. Smith
(74) *Attorney, Agent, or Firm*—Wells, St. John, Roberts, Gregory & Matkin, P.S.

(57) ABSTRACT

In one aspect, the invention includes a semiconductor processing method comprising a) forming a metal silicide layer over a substrate; b) depositing a layer comprising silicon, nitrogen and oxygen over the metal silicide layer; and c) while the layer comprising silicon, nitrogen and oxygen is over the metal silicide layer, annealing the metal silicide layer. In another aspect, the invention includes a gate stack forming method, comprising a) forming a polysilicon layer over a substrate; b) forming a metal silicide layer over the polysilicon layer; c) depositing an antireflective material layer over the metal silicide layer; d) forming a silicon nitride layer over the antireflective material layer; e) forming a layer of photoresist over the silicon nitride layer; f) photolithographically patterning the layer of photoresist to form a patterned masking layer from the layer of photoresist; and g) transferring a pattern from the patterned masking layer to the silicon nitride layer, antireflective material layer, metal silicide layer and polysilicon layer to pattern the silicon nitride layer, antireflective material layer, metal silicide layer and polysilicon layer into a gate stack. In yet other aspects, the invention encompasses circuitry and gate stacks.

19 Claims, 3 Drawing Sheets

U.S. PATENT DOCUMENTS

| | | |
|---|---|---|
| 5,600,165 | 2/1997 | Tsukamoto et al. . |
| 5,641,607 | 6/1997 | Ogawa et al. . |
| 5,648,202 | 7/1997 | Ogawa et al. . |
| 5,670,297 | 9/1997 | Ogawa et al. . |
| 5,674,356 | 10/1997 | Nagayama ............... 156/659.11 |
| 5,677,111 | 10/1997 | Ogawa . |
| 5,698,352 | 12/1997 | Ogawa et al. . |
| 5,710,067 | 1/1998 | Foote et al. ................... 437/238 |
| 5,731,242 * | 3/1998 | Parat et al. .................... 438/586 |
| 5,741,721 * | 4/1998 | Stevens ........................... 437/60 |
| 5,759,755 | 6/1998 | Park et al. ...................... 430/512 |
| 5,831,321 | 11/1998 | Nagayama . |
| 5,838,052 | 11/1998 | McTeer ......................... 257/437 |
| 5,872,385 | 2/1999 | Taft et al. . |
| 5,883,011 | 3/1999 | Lin et al. . |
| 5,960,289 | 9/1999 | Tsui et al. . |
| 5,968,324 | 10/1999 | Cheung et al. . |
| 6,008,124 * | 12/1999 | Sekiguchi et al. ............. 438/653 |
| 6,020,243 | 2/2000 | Wallace et al. . |

OTHER PUBLICATIONS

TEXT: Jenkins, F. et. al., "Fundamentals Of Optics", Properties Of Light, pp. 9–10.

TEXT: Heavens, O.S., "Optical Properties Of Thin Solid Films", pp. 48–49.

ARTICLE: Dammel, R.R., et. al., "Dependence Of Optical Constants Of AZ® BARLi™ Bottom Coating On Bake Conditions", *SPIE* vol. 3049 (1997), pp. 963–973.

ARTICLE: Bencher, C.N., et al., "Dielectric antireflective coatings for DUV lithography", *Solid State Technology,* Mar. 1997, pp. 109, 111–112, and 114.

McKenzie, D.R. et al., "New Technology for PACVD", Surface and Coatings Technology, vol. 82, pp. 326–333 (1996).

Shibata, N., "Plasma–Chemical Vapor–Deposited Silicon Oxide/Silicon Oxynitride Double–Layer Antireflective Coating for Solar Cells", Japanese Jour. of App. Physcis, vol. 30, No. 5, May 1991, pp. 997–1001.

U.S. Ser. No. 09/030,618, (as filed and as amended), Holscher Feb. 1998.

* cited by examiner

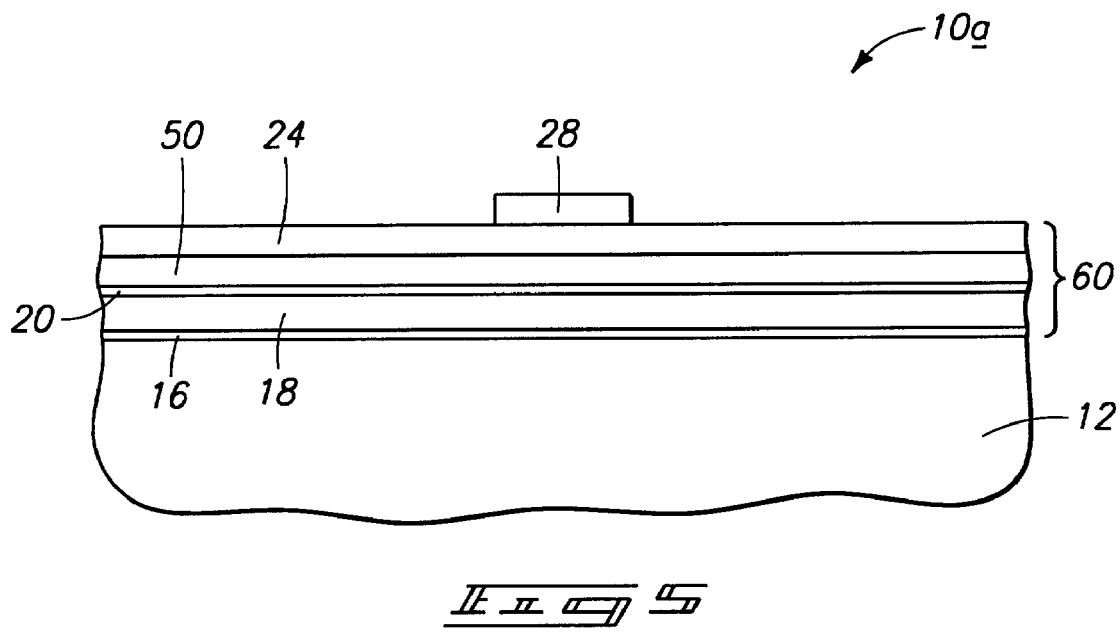
_FIG 5_
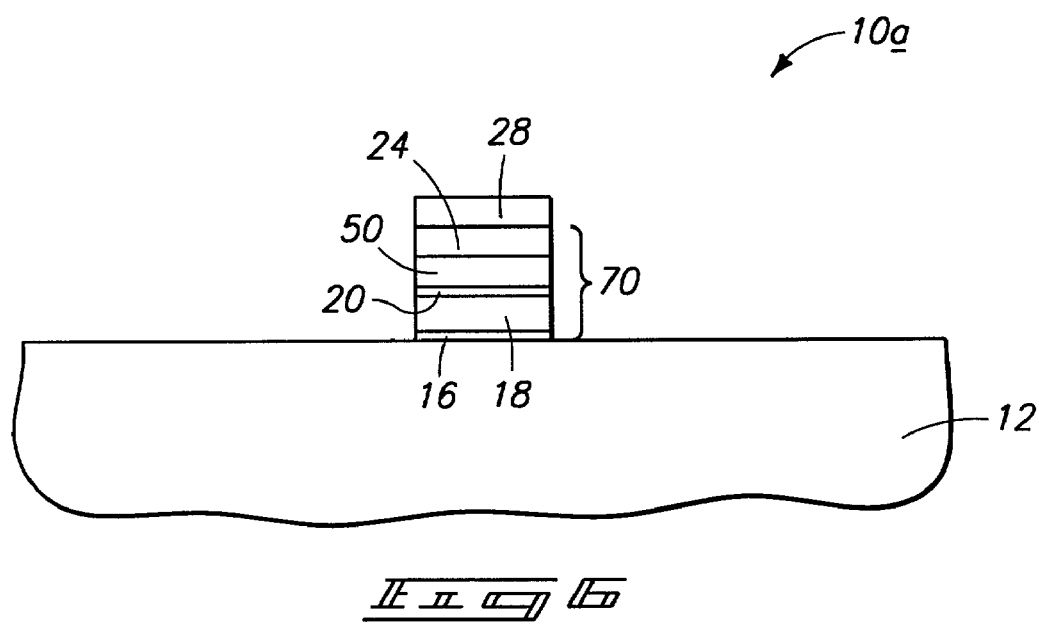
_FIG 6_

SEMICONDUCTOR PROCESSING METHODS

TECHNICAL FIELD

The invention pertains to methods of forming and utilizing antireflective materials. The invention also pertains to semiconductor processing methods of forming stacks of materials, such as, for example, gate stacks.

BACKGROUND OF THE INVENTION

Semiconductor processing methods frequently involve patterning layers of materials to form a transistor gate structure. FIG. 1 illustrates a semiconductive wafer fragment 10 at a preliminary step of a prior art gate structure patterning process. Semiconductive wafer fragment 10 comprises a substrate 12 having a stack 14 of materials formed thereover. Substrate 12 can comprise, for example, monocrystalline silicon lightly doped with a p-type background dopant. To aid in interpretation of the claims that follow, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Stack 14 comprises a gate oxide layer 16, a polysilicon layer 18, a metal silicide layer 20, an oxide layer 22, a nitride layer 24, an antireflective material layer 26, and a photoresist layer 28. Gate oxide layer 16 can comprise, for example, silicon dioxide, and forms an insulating layer between polysilicon layer 18 and substrate 12. Polysilicon layer 18 can comprise, for example, conductively doped polysilicon, and will ultimately be patterned into a first conductive portion of a transistor gate.

Silicide layer 20 comprises a metal silicide, such as, for example, tungsten silicide or titanium silicide, and will ultimately comprise a second conductive portion of a transistor gate. Prior to utilization of silicide layer 20 as a conductive portion of a transistor gate, the silicide is typically subjected to an anneal to improve crystallinity and conductivity of the silicide material of layer 20. Such anneal can comprise, for example, a temperature of from about 800° C. to about 900° C. for a time of about thirty minutes with a nitrogen ($N_2$) purge.

If silicide layer 20 is exposed to gaseous forms of oxygen during the anneal, the silicide layer can become oxidized, which can adversely effect conductivity of the layer. Accordingly, oxide layer 22 is preferably provided over silicide layer 20 prior to the anneal. Oxide layer 22 can comprise, for example, silicon dioxide. Another purpose of having oxide layer 22 over silicide layer 20 is as an insulative layer to prevent electrical contact of silicide layer 20 with other conductive layers ultimately formed proximate silicide layer 20.

Nitride layer 24 can comprise, for example, silicon nitride, and is provided to further electrically insulate conductive layers 18 and 20 from other conductive layers which may ultimately be formed proximate layers 18 and 20. Nitride layer 24 is a thick layer (a typical thickness can be on the order of several hundred, or a few thousand Angstroms) and can create stress on underlying layers. Accordingly, another function of oxide layer 22 is to alleviate stress induced by nitride layer 24 on underlying layers 18 and 20.

Antireflective material layer 26 can comprise, for example, an organic layer that is spun over nitride layer 24. Alternatively, layer 26 can be a deposited inorganic antireflective material, such as, for example, $Si_xO_yN_z$:H, wherein x is from 0.39 to 0.65, y is from 0.02 to 0.56, and z is from 0.05 to 0.33. In practice the layer can be substantially inorganic, with the term "substantially inorganic" indicating that the layer can contain a small amount of carbon (less than 1% by weight). Alternatively, if, for example, organic precursors are utilized, the layer can have greater than or equal to 1% carbon, by weight.

Photoresist layer 28 can comprise either a positive or a negative photoresist. Photoresist layer 28 is patterned by exposing the layer to light through a masked light source. The mask contains clear and opaque features defining a pattern to be created in photoresist layer 28. Regions of photoresist layer 28 which are exposed to light are made either soluble or insoluble in a solvent. If the exposed regions are soluble, a positive image of the mask is produced in photoresist layer 28 and the resist is termed a positive photoresist. On the other hand, if the non-radiated regions are dissolved by the solvent, a negative image results, and the photoresist is referred to as a negative photoresist.

A difficulty that can occur when exposing photoresist layer 28 to radiation is that waves of the radiation can propagate through photoresist 28 to a layer beneath the photoresist and then be reflected back up through the photoresist to interact with other waves of the radiation which are propagating through the photoresist. The reflected waves can constructively and/or destructively interfere with the other waves to create periodic variations of light intensity within the photoresist. Such variations of light intensity can cause the photoresist to receive non-uniform doses of energy throughout its thickness. The non-uniform doses can decrease the accuracy and precision with which a masked pattern is transferred to the photoresist. Antireflective material 26 is provided to suppress waves from reflecting back into photoresist layer 28. Antireflective layer 26 comprises materials which absorb and/or attenuate radiation and which therefore reduce or eliminate reflection of the radiation.

FIG. 2 shows semiconductive wafer fragment 10 after photoresist layer 28 is patterned by exposure to light and solvent to remove portions of layer 28.

Referring to FIG. 3, a pattern from layer 28 is transferred to underlying layers 16, 18, 20, 22, 24, and 26 to form a patterned stack 30. Such transfer of a pattern from masking layer 28 can occur by a suitable etch, such as, for example, a plasma etch utilizing one or more of Cl, HBr, $CF_4$, $CH_2F_2$, He, and $NF_3$.

After the patterning of layers 16, 18, 20, 22, 24 and 26, layers 28 and 26 can be removed to leave a patterned gate stack comprising layers 16, 18, 20, 22, and 24.

A continuing goal in semiconductor wafer fabrication technologies is to reduce process complexity. Such reduction can comprise, for example, reducing a number of process steps, or reducing a number of layers utilized in forming a particular semiconductor structure. Accordingly, it would be desirable to develop alternative methods of forming patterned gate stacks wherein fewer steps and/or layers are utilized than those utilized in the prior art embodiment described with reference to FIGS. 1–3.

SUMMARY OF THE INVENTION

In one aspect, the invention encompasses a semiconductor processing method. A metal silicide layer is formed over a substrate. An antireflective material layer is chemical vapor deposited in physical contact with the metal silicide layer. A layer of photoresist is applied over the antireflective material layer and patterned photolithographically.

In another aspect, the invention encompasses a gate stack forming method. A polysilicon layer is formed over a substrate. A metal silicide layer is formed over the polysilicon layer. An antireflective material layer is deposited over the metal silicide layer. A silicon nitride layer is formed over the antireflective material layer and a layer of photoresist is formed over the silicon nitride layer. The layer of photoresist is photolithographically patterned to form a masking layer from the layer of photoresist. A pattern is transferred from the masking layer to the silicon nitride layer, antireflective material layer, metal silicide layer and polysilicon layer to pattern the silicon nitride layer, antireflective material layer, metal silicide layer and polysilicon layer into a gate stack.

In yet another aspect, the invention encompasses a gate stack comprising a polysilicon layer over a semiconductive substrate. The gate stack further comprises a metal silicide layer over the polysilicon layer, and a layer comprising silicon, oxygen and nitrogen over the metal silicide. Additionally, the gate stack comprises a silicon nitride layer over the layer comprising silicon, oxygen and nitrogen.

BRIEF DESCRIPTION OF THE DRAWINGS

Preferred embodiments of the invention are described below with reference to the following accompanying drawings.

FIG. 5 is a view of the FIG. 4 wafer fragment at a processing step subsequent to that of FIG. 4.

FIG. 6 is a view of the FIG. 4 wafer fragment at a processing step subsequent to that of FIG. 5.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
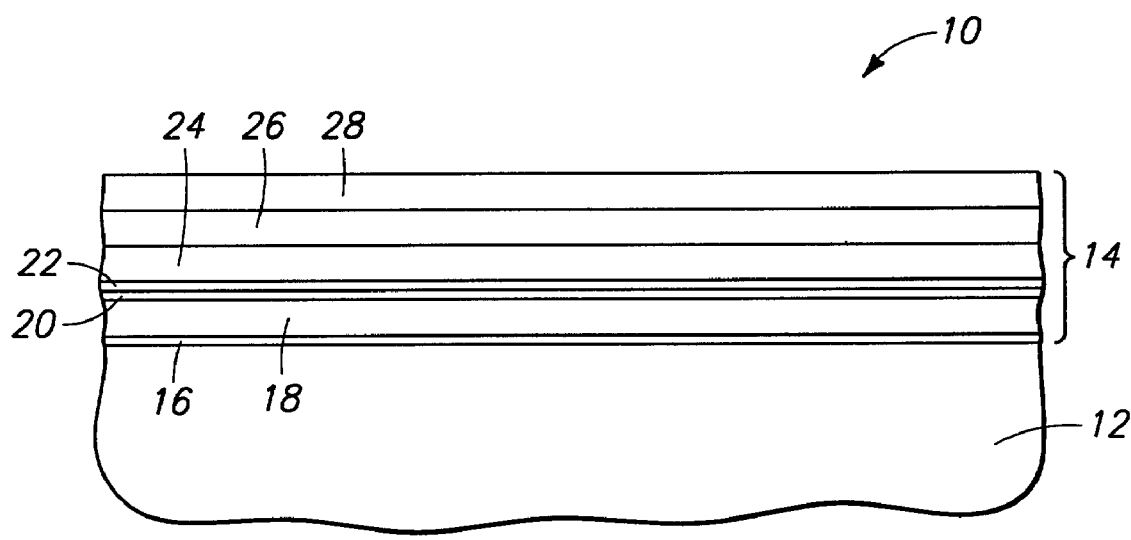
FIG. 1 is a fragmentary, diagrammatic, cross-sectional view of a semiconductive wafer fragment at a preliminary processing step of a prior art process.
Figure 2:
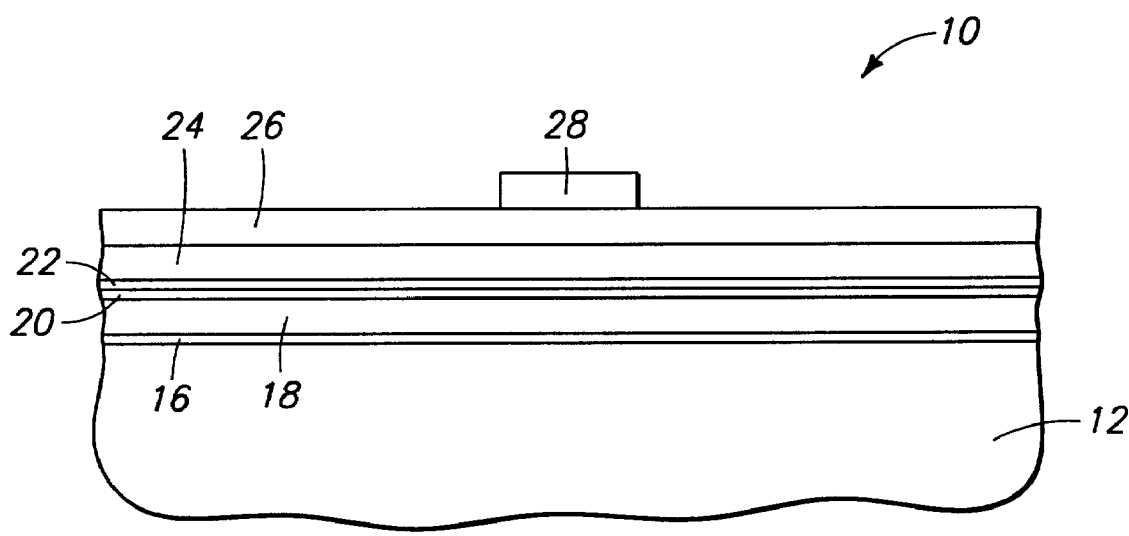
FIG. 2 is a view of the FIG. 1 wafer fragment at a prior art processing step subsequent to that of FIG. 1.
Figure 3:
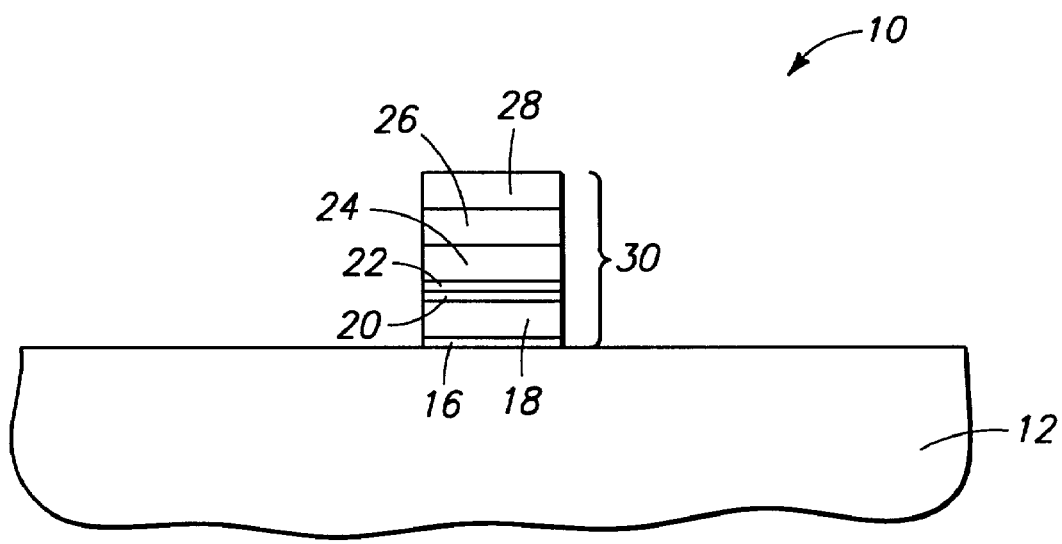
FIG. 3 is a view of the FIG. 1 wafer fragment at a prior art processing step subsequent to that of FIG. 2.

An embodiment encompassed by the present invention is described with reference to FIGS. 4–6. In describing the embodiment of FIGS. 4–6, similar numbering to that utilized above in describing the prior art processing of FIGS. 1–3 will be used, with differences indicated by the suffix "a", or by different numerals.

Figure 4:
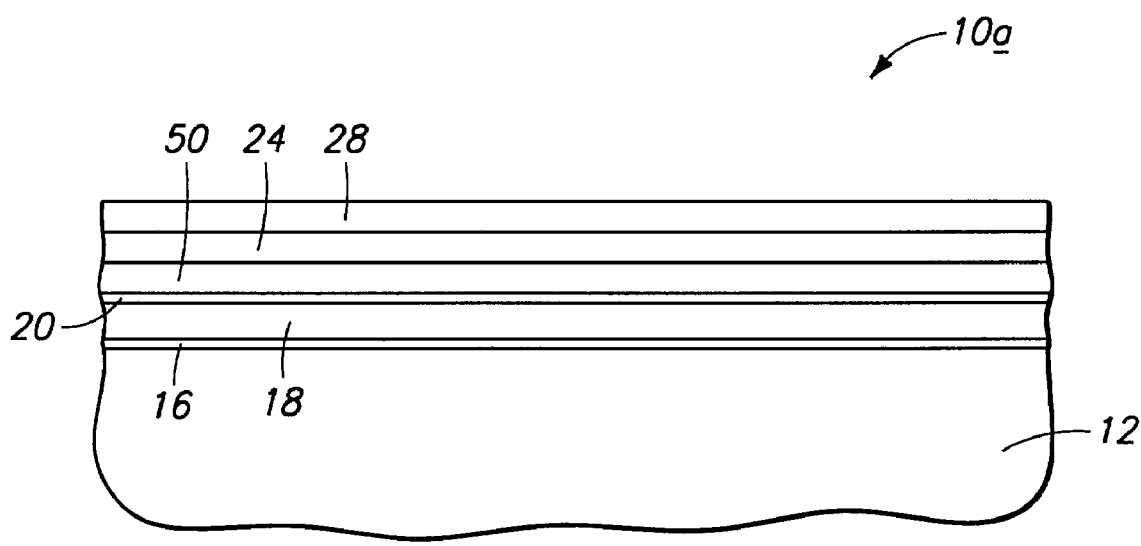
FIG. 4 is a fragmentary, diagrammatic, cross-sectional view of a semiconductive wafer fragment at a preliminary processing step of a method of the present invention.

Referring to FIG. 4, a semiconductive wafer fragment 10a is illustrated at a preliminary processing step. Wafer fragment 10a, like the wafer fragment 10 of FIGS. 1–3, comprises a substrate 12, a gate oxide layer 16, a polysilicon layer 18, and a silicide layer 20. However, in contrast to the prior art processing described above with reference to FIGS. 1–3, a layer 50 comprising silicon, nitrogen, and oxygen is formed over silicide 20, and in the shown preferred embodiment is formed in physical contact with silicide layer 20. Layer 50 thus replaces the oxide layer 22 of the prior art embodiment of FIGS. 1–3.

Layer 50 is preferably formed by chemical vapor deposition (CVD). Layer 50 can be formed by, for example, CVD utilizing $SiH_4$ and $N_2O$ as precursors, in a reaction chamber at a temperature of about 400° C. Such deposition can be performed either with or without a plasma being present within the reaction chamber. Exemplary conditions for depositing layer 50 include flowing $SiH_4$ into a plasma-enhanced CVD chamber at a rate of from about 40 standard cubic centimeters per minute (SCCM) to about 300 SCCM (preferably about 80 SCCM), $N_2O$ at a rate of from about 80 SCCM to about 600 SCCM (preferably about 80 SCCM), He at a rate from about 1300 SCCM to about 2500 SCCM (preferably about 2200 SCCM), with a pressure within the chamber of from about 4 Torr to about 6.5 Torr, and a power to the chamber of from about 50 watts to about 200 watts (preferably about 100 watts).

The above-described exemplary conditions can further include flowing nitrogen gas ($N_2$) into the reaction chamber at a rate of from greater than 0 SCCM to about 300 SCCM, and preferably at a rate of about 200 SCCM, and/or flowing $NH_3$ into the reaction chamber at a rate of from greater than 0 SCCM to about 100 SCCM.

An exemplary composition of layer 50 is $Si_xN_yO_z$:H, wherein x=0.5, y=0.37, and z=0.13. The relative values of x, y, z and the hydrogen content can be adjusted to alter absorbance characteristics of the deposited material. Layer 50 preferably has a thickness of from about 250 Å to about 650 Å.

Layer 50 is preferably provided over silicide layer 20 before annealing layer 20. Layer 50 thus provides the above-described function of oxide layer 22 (described with reference to FIGS. 1–3) of protecting silicide layer 20 from exposure to gaseous oxygen during annealing of the silicide layer.

A silicon nitride layer 24 is formed over layer 50, and can be in physical contact with layer 50. As discussed above in the background section of this disclosure, silicon nitride layer 24 can exert stress on underlying layers. Accordingly, layer 50 can serve a function of prior art silicon dioxide layer 22 (discussed with reference to FIGS. 1–3) of alleviating such stress from adversely impacting underlying conductive layers 20 and 18. Silicon nitride layer 24 can be formed over layer 50 either before or after annealing silicide layer 20.

A photoresist layer 28 is formed over silicon nitride layer 24. In contrast to the prior art embodiment discussed with reference to FIGS. 1–3, there is no antireflective material layer formed between silicon nitride layer 24 and photoresist layer 28. Instead, layer 50 is preferably utilized to serve the function of an antireflective material. Specifically, nitride layer 24 is effectively transparent to radiation utilized in patterning photoresist layer 28. Accordingly, radiation which penetrates photoresist layer 28 will generally also penetrate silicon nitride layer 24 and thereafter enter layer 50. Preferably, the stoichiometry of silicon, oxygen and nitrogen of layer 50 is appropriately adjusted to cancel radiation reaching layer 50 from being reflected back into photoresist layer 28. Such adjustment of stoichiometry can be adjusted with routine experimentation utilizing methods known to persons of ordinary skill in the art. Another way of describing the adjustment of layers 24 and 50 is that layers 24 and 50 can be tuned in thickness (by adjusting thickness of one or both of layers 24 and 50) and stoichiometry (by adjusting a stoichiometry of layer 50) such that reflection back into an overlying layer of photoresist is minimized.

Referring to FIG. 5, photoresist layer 28 is patterned to form a patterned mask over a stack 60 comprising layers 16, 18, 20, 50 and 24.

Referring to FIG. 6, a pattern from photoresist layer 28 is transferred to stack 60 (FIG. 5) to form a patterned gate stack 70 comprising layers 16, 18, 20, 50 and 24. Such transfer of a pattern from layer 28 can be accomplished by, for example, a plasma etch utilizing one or more of Cl, HBr, $CF_4$, $CH_2F_2$, He and $NF_3$. Photoresist layer 28 can then be removed from over gate stack 70. Subsequently, source and drain regions can be implanted adjacent the gate stack, and sidewall spacers can be provided over sidewalls of the gate stack to complete construction of a transistor gate from gate stack 70.

The method of the present invention can reduce complexity relative to the prior art gate stack forming method described above with reference to FIGS. 1–3. Specifically, the method of the present invention can utilize a single layer (50) to accomplish the various functions of protecting silicide during annealing, reducing stress from an overlying silicon nitride layer, and alleviating reflections of light during photolithographic processing of an overlying photoresist layer. Accordingly, the method of the present invention can eliminate an entire layer (antireflective layer 26 of FIGS. 1–3) relative to the prior art process described with reference to FIGS. 1–3. Such elimination of a layer also eliminates fabrication steps associated with forming and removing the layer. Accordingly, methods encompassed by the present invention can be more efficient semiconductor fabrication processes then prior art methods.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A semiconductor processing method comprising:
   forming a metal silicide layer over a substrate;
   depositing a layer comprising silicon, nitrogen and oxygen over the metal silicide layer; and
   while the layer comprising silicon, nitrogen and oxygen is over the metal silicide layer, annealing the metal silicide layer at a temperature of from about 800° C. to about 900° C.

2. A semiconductor processing method comprising:
   forming a metal silicide layer over a substrate;
   depositing a layer comprising silicon, nitrogen and oxygen over the metal silicide layer;
   while the layer comprising silicon, nitrogen and oxygen is over the metal silicide layer annealing the metal silicide layer; and
   wherein the layer comprising silicon, nitrogen and oxygen comprises $Si_xN_yO_z$:H, wherein x is from 0.39 to 0.65, y is from 0.02 to 0.56, and z is from 0.05 to 0.33.

3. The method of claim 2 further comprising forming a layer of silicon nitride over the layer comprising silicon, nitrogen, oxygen and hydrogen.

4. The method of claim 2 further comprising forming a layer of silicon nitride over the layer comprising silicon, nitrogen, oxygen and hydrogen before the annealing.

5. The method of claim 1 wherein the depositing comprises chemical vapor deposition.

6. The method of claim 1 further comprising forming a layer of silicon nitride over the layer comprising silicon, nitrogen and oxygen.

7. The method of claim 1 further comprising forming a layer of silicon nitride over the layer comprising silicon, nitrogen and oxygen before the annealing.

8. A semiconductor processing method comprising:
   forming a metal silicide layer over a substrate;
   depositing a layer comprising silicon, nitrogen and oxygen over the metal silicide layer;
   forming a layer of silicon nitride over the layer of silicon, nitrogen and oxygen; and
   wherein the layer comprising silicon, nitrogen and oxygen comprises $Si_xN_yO_z$:H, wherein x is from 0.39 to 0.65, y is from 0.02 to 0.56, and z is from 0.05 to 0.33.

9. A semiconductor processing method comprising:
   forming a metal silicide layer over a substrate;
   chemical vapor depositing an antireflective material layer in physical contact with the metal silicide, the deposited antireflective material layer comprising silicon, nitrogen, oxygen and hydrogen;
   forming a layer of photoresist over the antireflective material layer; and
   photolithographically patterning the layer of photoresist.

10. The method of claim 9 wherein the deposited antireflective material layer comprises silicon, nitrogen and oxygen.

11. The method of claim 9 wherein the deposited antireflective material layer comprises silicon, nitrogen, oxygen and hydrogen.

12. The method of claim 9 further comprising forming a silicon nitride layer over the deposited antireflective material layer, and wherein the layer of photoresist is formed over the silicon nitride layer.

13. A gate stack forming method, comprising:
   forming a polysilicon layer over a substrate;
   forming a metal silicide layer over the polysilicon layer;
   depositing an antireflective material layer over the metal silicide layer, the deposited antireflective material layer comprising silicon, nitrogen and oxygen;
   forming a silicon nitride layer over the antireflective material layer;
   forming a layer of photoresist over the silicon nitride layer;
   photolithographically patterning the layer of photoresist to form a patterned masking layer from the layer of photoresist; and
   transferring a pattern from the patterned masking layer to the silicon nitride layer, antireflective material layer, metal silicide layer and polysilicon layer to pattern the silicon nitride layer, antireflective material layer, metal silicide layer and polysilicon layer into a gate stack.

14. The method of claim 13 further comprising, while the antireflective layer is over the metal silicide layer, annealing the metal silicide layer.

15. The method of claim 13 wherein the depositing comprises chemical vapor deposition.

16. A gate stack forming method, comprising:
   forming a polysilicon layer over a substrate;
   forming a metal silicide layer over the polysilicon layer;
   depositing an antireflective material layer over the metal silicide layer;

forming a silicon nitride layer over the antireflective material layer;

forming a layer of photoresist over the silicon nitride layer;

photolithographically patterning the layer of photoresist to form a patterned masking layer from the layer of photoresist;

transferring a pattern from the patterned masking layer to the silicon nitride layer, antireflective material layer, metal silicide layer and polysilicon layer to pattern the silicon nitride layer, antireflective material layer, metal silicide layer and polysilicon layer into a gate stack; and wherein the deposited antireflective material layer comprises silicon, nitrogen, oxygen and hydrogen.

17. The method of claim 13 wherein the layer comprising silicon, nitrogen and oxygen physically contacts the metal silicide layer.

18. The method of claim 13 wherein the silicon nitride layer physically contacts the layer comprising silicon, nitrogen and oxygen.

19. The method of claim 13 wherein the silicon nitride layer physically contacts the layer comprising silicon, nitrogen and oxygen, and the layer comprising silicon, nitrogen and oxygen physically contacts the metal silicide layer.

* * * * *